(12) United States Patent
Argaut et al.

(10) Patent No.: US 6,395,974 B1
(45) Date of Patent: May 28, 2002

(54) PROTECTIVE PIPE ELEMENT FOR SHEATHED CABLE FOR CONTROLLING THE INTEGRITY OF THE SHEATH

(75) Inventors: Pierre Argaut; Pierre Gofflo, both of Paris (FR)

(73) Assignee: SAT (Societe Anonyme de Telecommunications), Paris (FR)

( * ) Notice: Subject to any disclaimer, the term of this patent is extended or adjusted under 35 U.S.C. 154(b) by 0 days.

(21) Appl. No.: 09/319,424

(22) PCT Filed: Nov. 28, 1997

(86) PCT No.: PCT/FR97/02152

§ 371 (c)(1),
(2), (4) Date: Aug. 30, 1999

(87) PCT Pub. No.: WO98/25151

PCT Pub. Date: Jun. 11, 1998

(30) Foreign Application Priority Data

Dec. 4, 1996 (FR) .............................. 96 14861

(51) Int. Cl.$^7$ ............................... H02G 15/24

(52) U.S. Cl. ...................... 174/21 R; 174/98

(58) Field of Search .................. 174/98, 68.3, 95, 174/70 C, 21 C, 21 JS, 21 R

(56) References Cited

U.S. PATENT DOCUMENTS

| | | | | | |
|---|---|---|---|---|---|
| 2,869,095 | A | * | 6/1959 | Arson | 174/21 JS |
| 3,154,632 | A | * | 10/1964 | Browne | 174/21 JS |
| 3,739,076 | A | * | 6/1973 | Schwartz | 174/21 C |
| 3,777,050 | A | * | 12/1973 | Silva | 174/21 R |
| 3,783,178 | A | * | 1/1974 | Philbert et al. | 174/21 JS |
| 3,945,699 | A | * | 3/1976 | Westrom | 339/12 R |
| 3,955,043 | A | * | 5/1976 | Palmer et al. | 174/21 R |
| 4,032,205 | A | * | 6/1977 | Taj | 174/21 R |
| 4,213,664 | A | * | 7/1980 | McClenan | 174/21 C |
| 4,547,623 | A | * | 10/1985 | Van Brunt et al. | 174/21 C |
| 4,867,687 | A | * | 9/1989 | Williams et al. | 439/10 |
| 5,429,529 | A | * | 7/1995 | Hashizawa et al. | 439/610 |
| 5,466,890 | A | * | 11/1995 | Stagnitti | 174/21 JS |
| 5,833,495 | A | * | 11/1998 | Ito | 439/610 |
| 5,941,717 | A | * | 8/1999 | Schauer et al. | 439/98 |

* cited by examiner

*Primary Examiner*—Dean A. Reichard
*Assistant Examiner*—Adolfo Nino
(74) *Attorney, Agent, or Firm*—Greenberg Traurig, LLP; Eugene C. Rzucidlo

(57) ABSTRACT

The duct element intended to accommodate, on its internal wall (14), a sheathed electrical or optical cable (4) in order to protect it has its internal wall (14) and external wall (13) electrically connected in order thereby to make an element for checking the integrity of the sheath (6) of the cable (4); preferably, it is made of a conductive material.

6 Claims, 1 Drawing Sheet

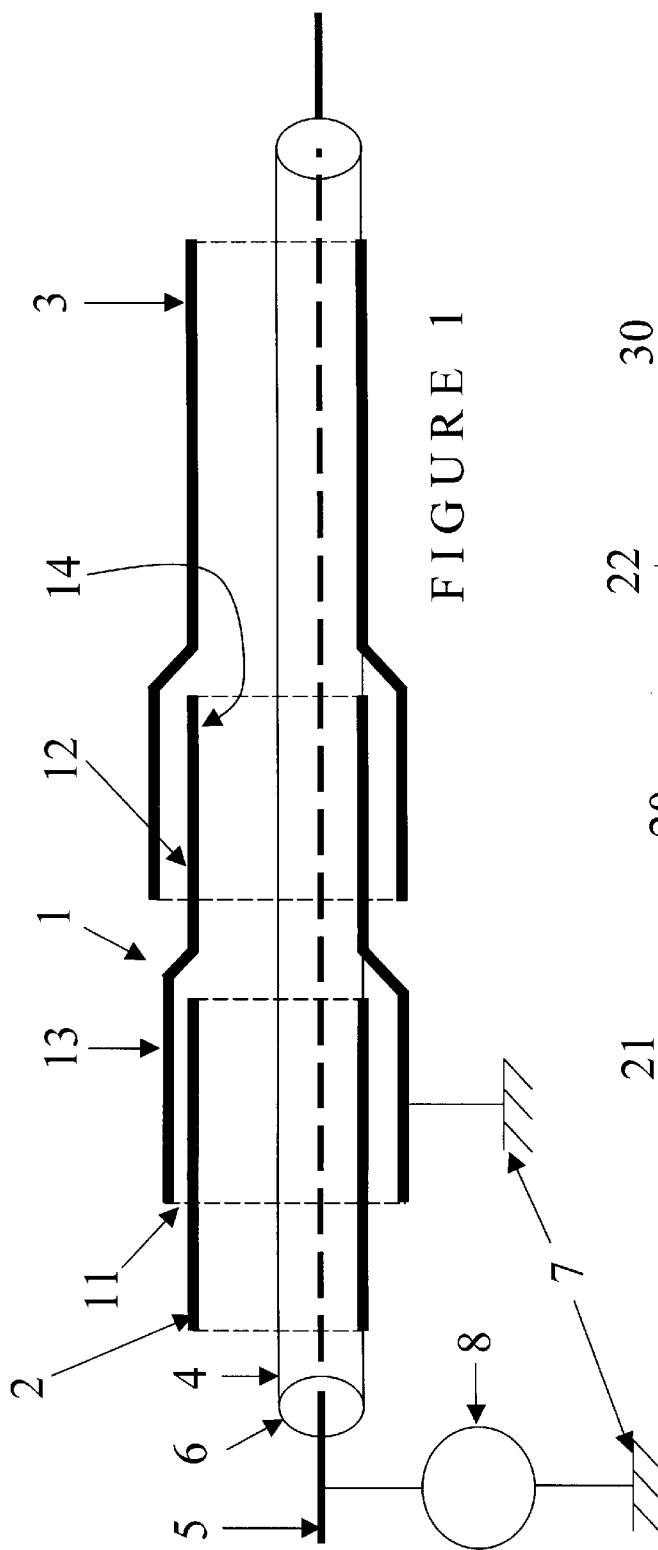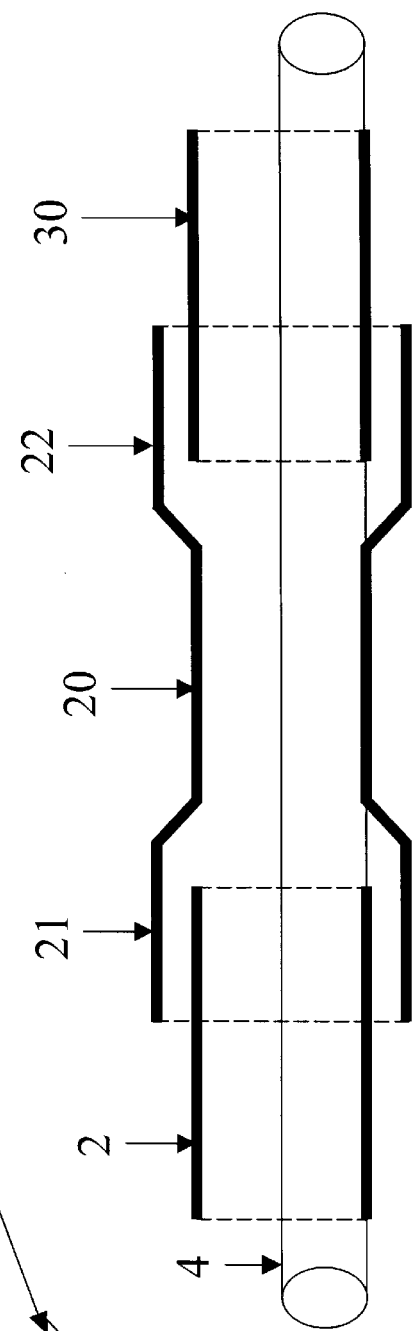

PROTECTIVE PIPE ELEMENT FOR SHEATHED CABLE FOR CONTROLLING THE INTEGRITY OF THE SHEATH

BACKGROUND OF THE INVENTION

When an electrical or optical cable is being installed, it is generally made to pass through a duct intended for its mechanical protection. This is particularly useful in the case of an underground cable, which is not visible and therefore liable to be damaged.

The cables in question generally comprise conductors or fibers arranged in a common sheath which mechanically protects the assembly. They may include a mechanical reinforcement member which prevents any excessive elongation which would run the risk of breaking the conductors when the cable is being pulled through the duct.

To reduce the cost, while making handling easier, the duct is often made of plastic.

When an underground cable has just been installed, a test is made of the insulation between its conducting elements and earth so as to check that the sheath has not suffered during the installation operations. This is because a damaged sheath allows moisture to infiltrate, which could then damage the cable.

To check this insulation, a voltage is applied between the conducting elements and earth and if the measured insulation between the two is not perfect, there is electrical leakage and hence a risk of moisture getting in.

When the sheathed cable is placed in a duct, the presence of the latter causes difficulty as it introduces an additional insulation which precludes correct measurement of the insulation of the cable sheath.

However, it is necessary to detect any sheath defect from the outset so as to guarantee the desired reliability of the cable.

The problem that arises is how to check the integrity of the sheath of a cable installed in a protective duct and to measure any electrical leakage between the protective sheath and any internal electrical conductor, namely an electrical element, when there is one, or a mechanical reinforcement member, when there is one.

SUMMARY OF THE INVENTION

To solve this problem, the invention proposes a duct element intended to accommodate, on its internal wall, a sheathed electrical or optical cable in order to protect it, characterized in that the internal wall and the external wall of the duct element are electrically connected in order thereby to make an element for checking the integrity of the sheath of the cable.

Thus, the cable is set to the potential of the outside of the duct element and is therefore electrically accessible in order to allow a test of the insulation of the outside of the cable—a priori its insulating sheath - to be made.

BRIEF DESCRIPTION OF THE DRAWINGS

FIG. 1 depicts a cut-away view of one preferred embodiment of the present invention.

FIG. 2 depicts an alternative embodiment of the present invention.

DETAILED DESCRIPTION OF THE PREFERRED EMBODIMENT

The invention will be more clearly understood with the help of the following description of two preferred embodiments of the duct element of the invention, with reference to FIGS. 1 and 2 of the appended drawing which show, in axial section, the two embodiments, respectively.

In FIG. 1, the duct element, bearing the reference 1, in this case brings into abutment two portions 2, 3 of a conventional plastic duct through which a cable 4 having an electrical conductor 5 surrounded by an insulating sheath 6 has been passed in order to protect it. In this case, the assembly is earthed at 7 and the link terminating there in FIG. 1 merely illustrates this fact.

The element 1 is in this case of tubular shape, with two ends 11, 12 for connection by interlocking, which respectively accommodate, by sliding, the ends of the two protective duct portions 2, 3 so as, in this example, to maintain the desired sealing of the duct. The radial clearance between the pieces 1, 2 and 2, 3 has been intentionally exaggerated in the drawing for the sake of clarity. The female end 11 internally accommodates one end of the duct portion 2, while the end of the duct portion 3 internally accommodates the male end 12. A sealing adhesive may be provided, or else shape matching may be provided by thermo-forming. The element 1 has an internal wall 14 and an external wall 13 which are electrically connected in order thereby to make a device for testing the insulation of the cable 4, or more precisely of its sheath 6. The outside of the sheath 6 is in fact in contact with the internal wall 14, which is at the same potential as the external wall 13, namely that of the earth 7.

In this example, the entire element 1 is for this purpose a sleeve made of a conductive material based on a carbon-doped plastic.

The reference number 8 represents symbolically an AC test voltage supply connecting the conductor 5 to the earth 7. Should there be a fault in the sheath 6, a leakage current can thus pass more easily through the sheath in order to flow between the conductor 5 and the earth 7 and be detected at the supply 8. Thus, the element 1 is a test device interacting with the test supply 8.

If the fault lies in a region of the sheath 6 which is not in contact with the internal wall 14, it will be able to be detected if it close enough to the contact region of the internal wall 14 for a detectable leakage current to be able to flow, in or over the sheath 6 or along the internal wall of the duct portion 2 or 3, between the above earthed contact region and this fault. For this purpose, in order to use the earth potential at regular intervals, the entire duct consists of an alternation of duct portions such as 2, 3 and of elements such as 1. Thus, any cable, whether electrical or optical, having an electrical conductor may be checked.

To make the checking device even more effective, it may be desirable to use a cable sheath whose surface is relatively conductive, for example by incorporating carbon black into the material used for extruding the sheath.

It may also be desirable to coat the cable sheath and/or the internal wall of the duct with a coating of carbon black or with a conductive grease of greater or lesser conductivity.

It may be imagined that the duct portions 2, 3 could come into abutment with the element 1 in various other ways, for example by means of radial stops.

It will be understood that, since the function of the duct element of the invention is to provide electrical continuity between its internal wall and its external wall, this function is conveniently fulfilled when, as in the above example, the mechanical construction of the duct element is that of a duct, and this duct element can thus be inserted between two duct portions. However, the duct element of the invention may not have such a mechanical function and it may, for example, be in the form of a simple conductive strip intended to go across, in a sealed or unsealed manner, the wall of the duct. FIG. 3 depicts as illustrative conductive strip 31 with external wall 33 and internal wall 34. The other elements are unchanged and keen the same reference numbers as in FIG. 1. For example, a conductive thin sheet or conductive pliant fabric interposed between the complementary, and therefore directly interlocked, ends of the duct portions 2, 3 may be imagined, the sheet or fabric extending inside and outside the duct portions 2, 3.

The embodiment shown in FIG. 2 differs from that in FIG. 1 only by the fact that the duct element 20 has two identical female tubular connection ends 21, 22, the end of the duct portion 30, equivalent to the duct portion 3, then being similar to that of the duct portion 2. The other elements, which are unchanged, keep their reference numbers.

What is claimed is:

1. A protective duct element comprising two ends, an interior wall, and an exterior wall, said duct element designed to be connected at its two ends to two protective duct portions to accommodate, on its internal wall (14), a sheathed electrical or optical cable (4) passed through the duct in order to protect it, characterized in that the internal wall (14) and the external wall (13) of the duct element are electrically connected to each other and to the sheath of the cable in order thereby to make an element for checking the integrity of the sheath (6) of the cable (4).

2. Duct element according to claim 1, wherein at least one of said two ends comprises a female connection end (11, 21).

3. Duct element according to claim 1, wherein one of said two ends comprises a male connection end (12).

4. Duct element according to claim 1 or claim 2, wherein said duct element is made of a conductive material.

5. Duct element according to claim 1 wherein said duct element is made of a conductive pliant fabric.

6. Duct element according to claim 3, wherein said duct element is made of a conductive material.

* * * * *